(12) United States Patent
Zami et al.

(10) Patent No.: US 6,473,225 B1
(45) Date of Patent: Oct. 29, 2002

(54) LIGHT AMPLIFIER DEVICE

(75) Inventors: Thierry Zami, Massy; Dominique Chiaroni, Antony; Nicolas Le Sauze, Chaville; Alain Pons, Ollainville; Jean-Yves Emery, Palaiseau; François Dorgeuille, Paris, all of (FR)

(73) Assignee: Alcatel, Paris (FR)

( * ) Notice: Subject to any disclaimer, the term of this patent is extended or adjusted under 35 U.S.C. 154(b) by 62 days.

(21) Appl. No.: 09/791,606

(22) Filed: Feb. 26, 2001

(30) Foreign Application Priority Data

Mar. 16, 2000 (FR) .............................. 00 03373

(51) Int. Cl.$^7$ ................................ H01S 3/00
(52) U.S. Cl. .......................... 359/344; 359/337
(58) Field of Search ................... 359/344, 337

(56) References Cited

U.S. PATENT DOCUMENTS

| | | | | |
|---|---|---|---|---|
| 5,264,960 A | * | 11/1993 | Glance | 359/334 |
| 6,043,931 A | * | 3/2000 | Jourdan et al. | 359/341 |
| 6,101,027 A | * | 8/2000 | Lee et al. | 359/344 |

FOREIGN PATENT DOCUMENTS

| | | |
|---|---|---|
| EP | 0 881 790 A1 | 12/1998 |
| EP | 1 134 859 A1 * | 9/2001 |
| JP | 03 017 633 | 1/1991 |
| JP | 02001069085 A * | 3/2001 |

OTHER PUBLICATIONS

Manabu Yoshino et al.: "Improvement of Saturation Output Power in a Semiconductor Laser Amplifier Through Pumping Light Injection", IEEE Photonics Technology Letters, IEEE Inc., New York US, vol. 8, No. 1, 1996, pp. 58–59, XP000547533, ISSN: 1041–1135.

Ma, B. et al.: "Realization of All–Optical Wavelength Converter Based on Directionally Coupled Semiconductor Optical Amplifiers" IEEE Photonics Technology Letters, IEEE Inc., New York, US, vol. 11, No. 2, Feb. 1999, pp. 188–190, XP000803424, ISSN: 1041–1135.

* cited by examiner

Primary Examiner—Mark Hellner
(74) Attorney, Agent, or Firm—Sughrue Mion, PLLC

(57) ABSTRACT

In order to be able to use a semiconductor light amplifier of conventional type and operating under gain saturation conditions while nevertheless providing constant gain for an optical signal to be amplified, the device comprises means for producing a compensation light wave and coupling means for injecting the optical signal to be amplified and the compensation light wave into the amplifier. The compensation light wave presents amplitude modulation such that when combined with the optical signal to be amplified the overall amplitude modulation is eliminated or at least attenuated. The device is applicable to optical transmission systems operating at a single wavelength or with wavelength division multiplexing.

12 Claims, 4 Drawing Sheets

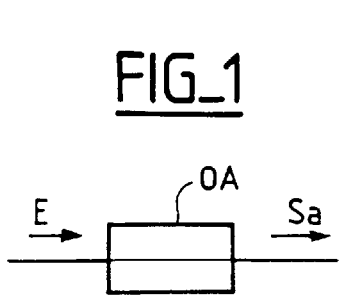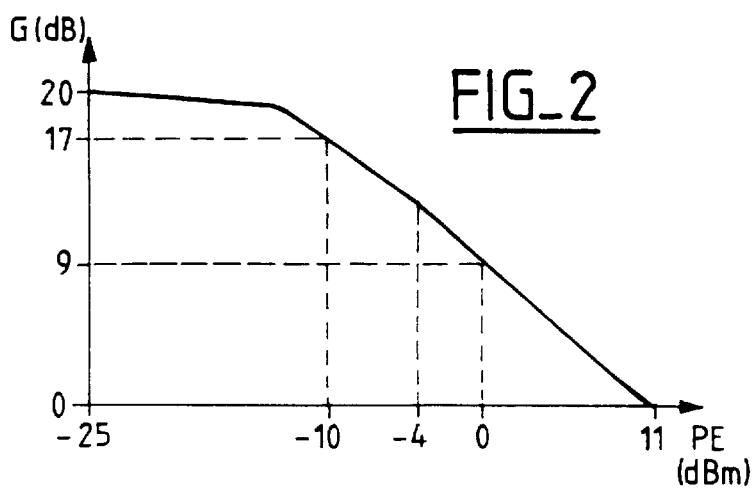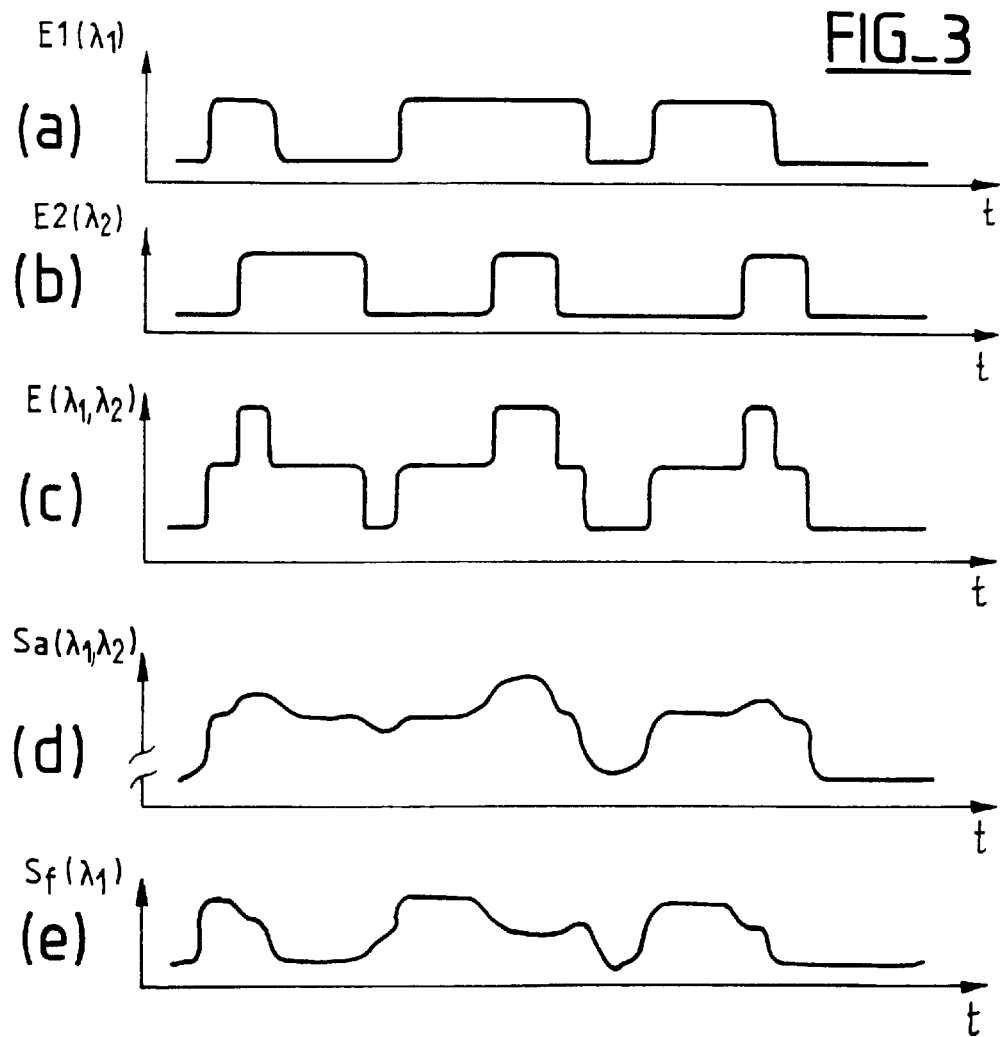

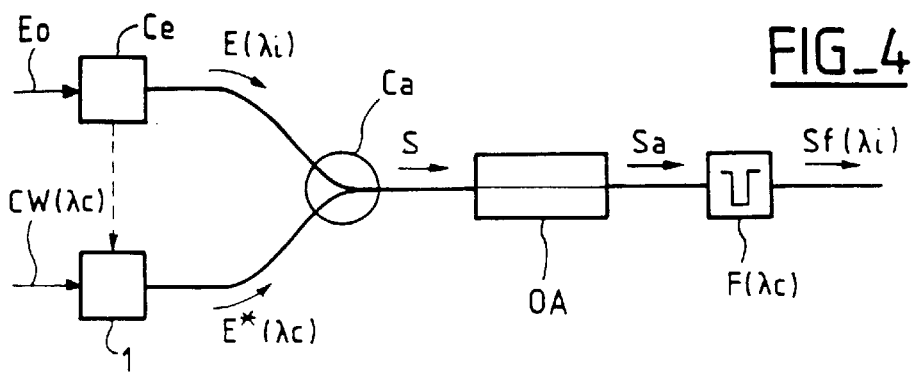
FIG_4
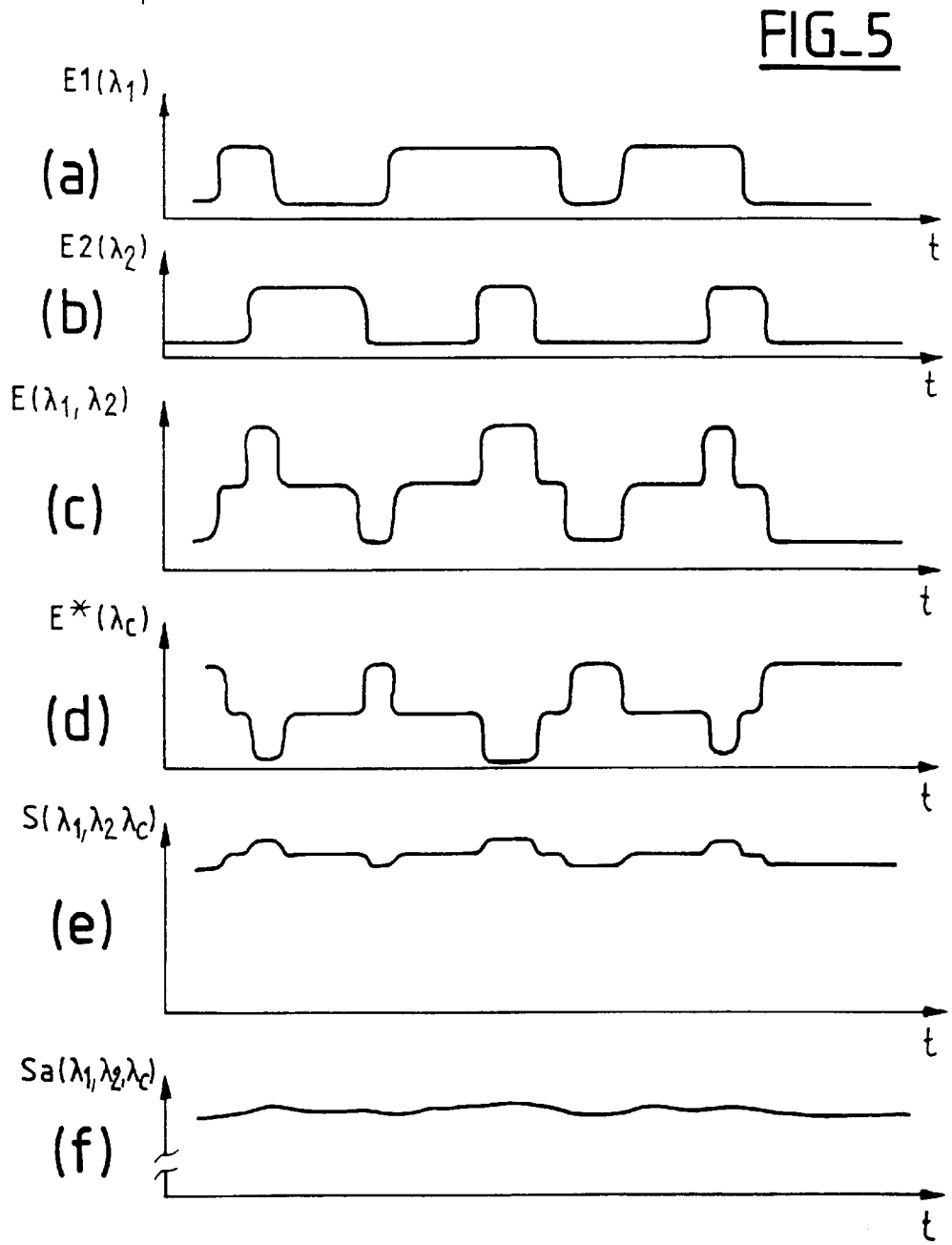
FIG_5

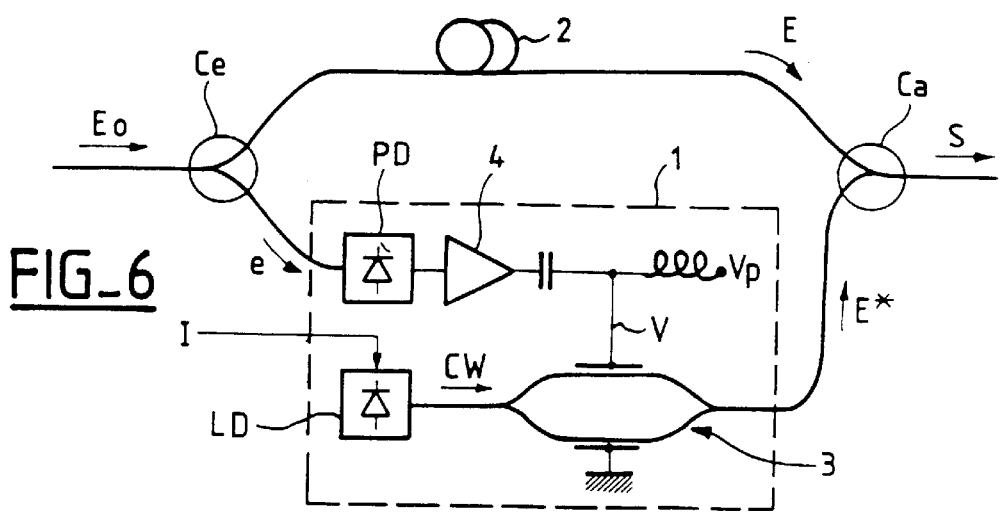
FIG_6
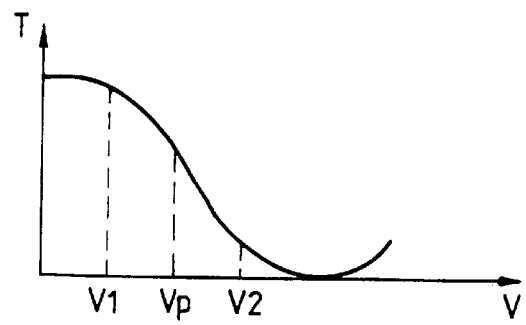
FIG_7
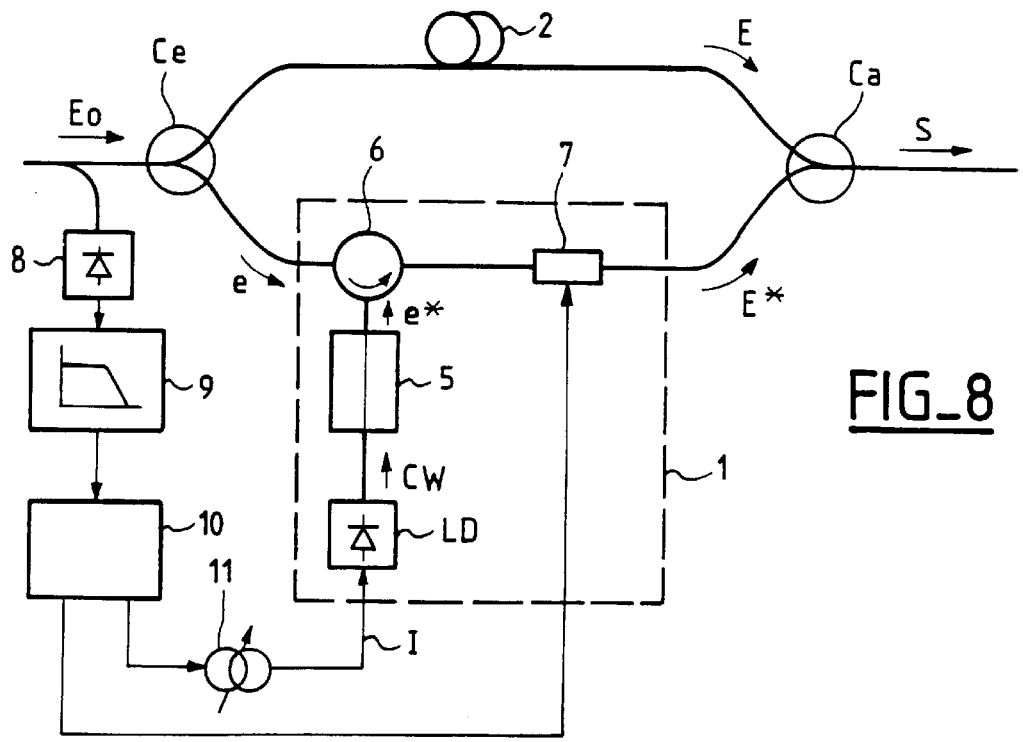
FIG_8

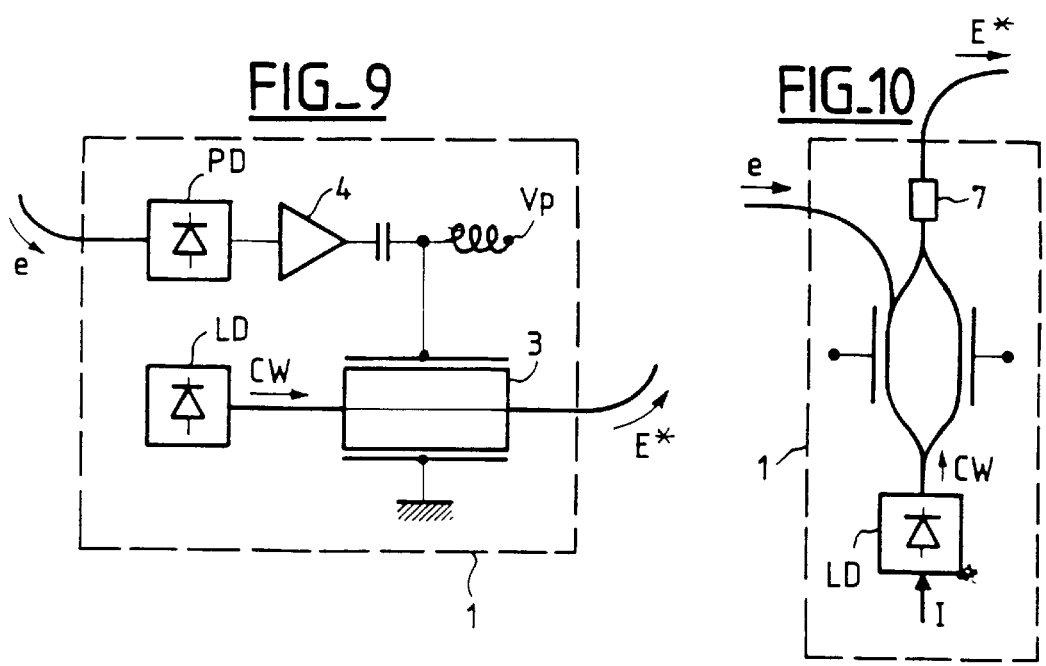
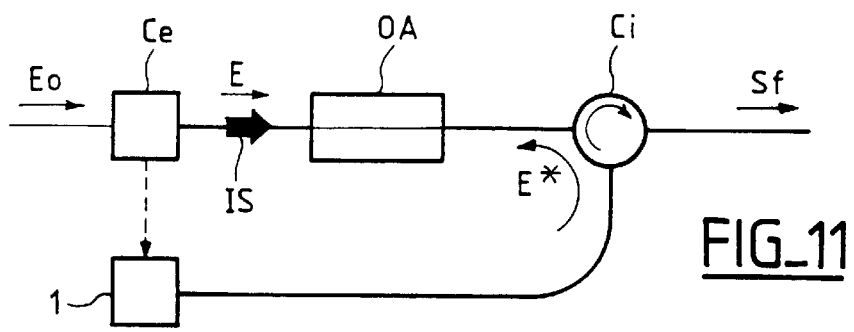
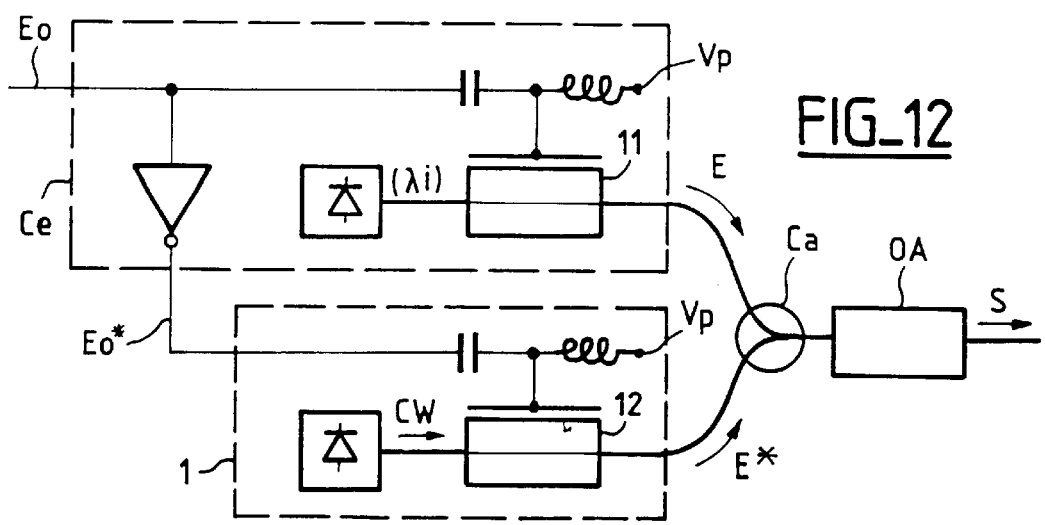

LIGHT AMPLIFIER DEVICE

The invention lies in the field of optical transmission systems operating at a single wavelength or with wavelength division multiplexing (WDM). The invention relates more particularly to amplifying the optical signals conveyed in such systems.

BACKGROUND OF THE INVENTION

In general, amplitude-modulated optical signals for transmission purposes are amplified by means of fiber amplifiers such as erbium-doped fiber amplifiers since they do not present gain non-linearity as a function of input signal power at the modulation frequencies (of the order of 100 MHz to 10 GHz) of the signals used. Although such amplifiers do indeed present a phenomenon of saturation gain, when transmitting binary signals at several gigabits per second, the lifetime of the carriers is long enough relative to the bit time to ensure that gain remains insensitive to the fluctuations in light power that correspond to the binary modulation.

However, with semiconductor light amplifiers, the carrier lifetime is short enough so that under saturation conditions gain varies with the modulation rate. This degrades the extinction ratio and corresponds to compressing gain. However if it is desired to conserve a linear response, then input light power must be limited, which is unfavorable for signal-to-noise ratio.

This problem arises in particular when amplifying a single wavelength signal. With a WDM signal, the instantaneous light power injected into the amplifier is the sum of the powers of the channels constituting the signal and the pulses in a plurality of channels are superposed in varying numbers at each instant, but often with random phases. This can give rise to strong temporary variations at high frequency in the total power of the signal, but these frequencies are generally filtered by the amplifier. However, if the pulses are in phase, then the problem becomes highly critical. After amplification and spectrum demultiplexing, the pulses in each channel present extinction ratios that are degraded and variable from one pulse to another, which harms the quality with which level detection takes place at the receiver.

The problem of gain saturation in semiconductor light amplifiers also arises when they are used as optical gates in switching systems for optical networks. In order to accommodate high data rates, it is necessary to have a good signal-to-noise ratio. That requires the signals injected into the gates to be at high power, but under such circumstances, their extinction ratio is degraded.

Thus, in spite of the cost and compactness advantages of semiconductor amplifiers, their field of use is limited.

To resolve this problem, a first approach consists in seeking to increase the saturation power thereof by optimizing their dimensioning and the composition of the semiconductor layers making them up, or by adopting active structures that are complex, e.g. multiple quantum wells.

Another approach consists in using an amplifier whose gain is stabilized, e.g. as described in European patent application EP-A-0 639 876 published on Feb. 22, 1995. That solution does indeed enable the linear operating range of the amplifier to be extended, but it presents the drawback of a limited dynamic range in terms of power, which is particularly constricting with WDM signals. In addition, the gain of stabilized-gain amplifiers is set on manufacture, thus reducing flexibility of the amplifier faced with the variety of applications and contexts of use.

OBJECTS AND SUMMARY OF THE INVENTION

An object of the invention is to avoid the limitations of the methods mentioned above. For this purpose, the invention proposes a solution using external means that enable conventional type semiconductor amplifiers to be used operating under gain saturation conditions while also providing gain that is constant for the modulated signals that are to be amplified.

More precisely, the invention provides a device for using a semiconductor light amplifier to amplify an amplitude-modulated optical signal referred to as the signal to be amplified and carried by at least one signal wavelength, the device comprising:

compensation means for producing a compensation light wave; and coupling means for injecting said optical signal to be amplified and said compensation light wave into said amplifier;

and wherein said compensation means comprise modulation means that are controlled directly as a function of the modulation of the signal to be amplified so as to produce said compensation light wave by amplitude modulating at least one auxiliary light carrier wave in such a manner that the combination of said optical signal to be amplified and of said compensation light wave has amplitude modulation that is suppressed or at least attenuated.

To ensure there is no modulation of the total light power injected into the amplifier, it would be necessary for the compensation wave generated by the modulation means to be modulated inversely relative to the modulation of the optical signal to be amplified and for the modulation amplitudes of the signal and of the compensation wave to be equal in absolute value at all times. However, even if those conditions are not satisfied in full, a significant improvement in the linearity of amplification is still obtained.

According to an additional characteristic of the invention, said auxiliary light carrier wave has a compensation wavelength that is different from said signal wavelength(s). This disposition is necessary when the compensation wave and the optical signal to be amplified are codirectional, i.e. when they propagate in the same direction within the amplifier, since it must be possible subsequently to eliminate the compensation wave by filtering. In the opposite case, this disposition is nevertheless desirable in practice in order to ensure that beat noise between the signal and the compensation wave is avoided.

In numerous applications, it is necessary to amplify a signal that is received in optical form. The signal as received or a sample taken from said signal constitutes an input signal to the device, and the modulation means must then transfer the inverse of its modulation (i.e. in phase opposition) onto the compensation wavelength. Furthermore, the compensation wave and the signal to be amplified, i.e. the signals together making up said input signal injected into the amplifier, must be modulated in properly synchronous manner.

In addition, in the device of the invention, said compensation means include a delay device supplying said signal to be amplified from an input optical signal, and said modulation means are suitable for modulating the amplitude of said auxiliary light carrier wave inversely relative to the modulation of said input signal.

To attenuate modulation of the total light power injected into the amplifier to a significant extent, it is appropriate for the modulation means to present good linearity relative to the complement of the input signal. This object can be easily achieved using optoelectronic conversion means followed by electrooptical conversion means.

Thus, in a first possible embodiment, the modulation means comprise a photodetector receiving a portion of the input optical signal and controlling an electrooptical modulator. The compensation light wave is then the result of the auxiliary wave being modulated by means of the electrooptical modulator.

Whatever the electrooptical modulator that is selected, it is always possible to obtain a response that is sufficiently linear by adjusting the applied control and/or by limiting the excursion of said control. Furthermore, by adjusting the power level of the auxiliary wave, it is possible to equalize the modulation amplitudes of the signal to be amplified and of the compensation wave.

The electrooptical modulator can have an interfero-meter structure or it can be an electroabsorption modulator. Electroabsorption can be preferable to achieve a linear response over a wider range of modulation amplitudes. In a variant, the electrooptical modulator and the laser source are constituted by a laser with an integrated modulator.

The modulation means can also be implemented in fully optical manner. At very high data rates, this solution presents the advantage of avoiding the need to develop electronic circuits capable of operating at such high frequencies.

Thus, in a second possible embodiment, the modulation means comprise a second semiconductor light amplifier receiving said auxiliary light carrier wave and a fraction of said input optical signal, said compensation light wave being the result of amplifying said auxiliary wave by means of said second amplifier whose gain is modulated by said fraction of the input optical signal.

In a variant, the modulation means comprise an interferometer structure provided with two branches, each having first and second ends, said first ends receiving respective fractions of said auxiliary wave, one of said branches including a material whose index varies as a function of the light power received and receiving a fraction of said input optical signal, said second ends being coupled together to provide said compensation light wave.

The invention can also apply to cases when the optical signal to be amplified is produced from an input signal available in electrical form. The modulation means can then be used directly on said input electrical signal.

In which case, said modulation means are constituted by an electrooptical modulator receiving said auxiliary wave and controlled by an electrical signal complementary to said input electrical signal.

Advantageously, the semiconductor light amplifier has a cutoff frequency that is lower than that of said modulation means.

BRIEF DESCRIPTION OF THE DRAWINGS

Other aspects and advantages of the invention will appear on reading the description below given with reference to the figures.

FIG. 1 shows a semiconductor light amplifier as used in the present invention.

FIG. 2 is a graph showing the gain curve of the FIG. 1 amplifier.

FIG. 3 is a timing diagram for explaining the operation of the FIG. 1 amplifier.

FIG. 4 is a diagram of a device of the invention.

FIG. 5 is a timing diagram for explaining the operation of the FIG. 4 device.

FIG. 6 shows a first embodiment of the device of the invention.

FIG. 7 is a graph showing variations in the transmission of an electrooptical modulator of interfero-metric structure.

FIG. 8 shows a second embodiment of the device of the invention.

FIGS. 9 to 11 show variant embodiments of the device as shown respectively in FIGS. 6, 8, and 4.

FIG. 12 shows a third embodiment of the device of the invention.

MORE DETAILED DESCRIPTION

The semiconductor light amplifier OA shown diagrammatically in FIG. 1 is of conventional type. At its input it normally receives a signal to be amplified E, and at its output it delivers an amplified signal SA.

The gain G of the amplifier is defined as the ratio of the light power of the output signal SA over the light power of the input signal E.

Gain G varies as a function of the light power PE of the input signal E in compliance with a gain curve of the kind shown by way of example in FIG. 2. In FIG. 2, gain is expressed in decibels and light power in dBm.

At low light powers, gain is constant and the amplifier operates under linear conditions. However, above a certain level of input power, the value of the gain decreases with increasing power.

The saturation power at the input of the amplifier is defined as the input power for which the value of the gain is equal to half the maximum gain of the amplifier, i.e. when gain is expressed in dB, for a value that is 3 dB below the maximum gain. In the example shown, maximum gain is 20 dB and saturation power is −10 dBm. Beyond the saturation power, gain in dB decreases practically linearly as a function of the input light power in dBm.

The timing diagrams of FIG. 3 serve to explain how the amplifier operates when the signal to be amplified is a WDM signal. To simplify, it is assumed that the multiplex is constituted by only two channels corresponding to signals E1 and E2 carried by respective signal wavelengths $\lambda 1$ and $\lambda 2$.

In the example represented by timing diagrams (a) and (b), the information conveyed by the signals E1 and E2 is written in the form of amplitude modulation (or light power) on carrier waves at the wavelengths $\lambda 1$ and $\lambda 2$. These are binary signals using an NRZ code format.

The instantaneous light power of the multiplex signal E is the sum of the instantaneous powers of the two signals E1 and E2, and it thus presents amplitude modulation of the kind shown in diagram (c).

At its output, the amplifier OA delivers the amplified signal Sa. Given the gain saturation described above, the high power levels are amplified less than the low power levels, so the modulation is deformed as shown by diagram (d). Thereafter, in order to be able to extract channel E1 for example, filtering is performed on the wavelength $\lambda 1$. A filtered signal Sf is thus obtained which presents modulation that is highly deformed, as shown by diagram (e).

If the channels are also both synchronous and numerous, then deformation can be very great and can lead to numerous read errors at the receiver, even with signals that are digital.

In accordance with the invention, the device shown in principle in FIG. 4 enables this problem to be solved.

The device comprises the semiconductor light amplifier OA and coupling means Ca enabling the combination S of the optical signal to be amplified E and a compensation light wave E* to be injected therein.

The signal to be amplified E is generally obtained by an input interface Ce which receives an input signal EO which can be an optical signal at a single wavelength, or as before, a WDM signal made up of a plurality of signals carried on respective signal wavelengths λi. The input signal EO can also be an electrical signal, in which case the interface Ce performs an electrooptical converter function.

The compensation wave E* is produced by modulation means 1 responsive to the modulation of the input signal EO and thus to the modulation of the signal to be amplified E. They are designed to modulate at least one auxiliary light carrier wave CW at a compensation wave-length λc, so that the combination S of the signal E with the wave E* presents amplitude modulation that has been eliminated or at least attenuated. At its output, the amplifier OA delivers the amplified combination signal Sa.

In the circuit shown, the signal E and the compensation wave E* are codirectional, i.e. they are both injected into the amplifier via the same face. Under such circumstances, a stop filter F is provided downstream that is tuned to the compensation wavelength λc. Naturally, the compensation wavelength λc must be distinct from the signal wavelengths λi so that the filter can extract the compensation wave E* and forward the useful amplified signal Sf.

In a variant shown in FIG. 11, the signal E and the compensation wave E* are contradirectional, i.e. they are injected into the amplifier via opposite faces. The coupling means Ca comprise firstly an isolator IS disposed between the input interface Ce and a first face of the amplifier OA, and secondly a circulator Ci placed between the modulation means 1 and a second face of the amplifier OA. Under such circumstances, it is no longer necessary to have a stop filter F placed downstream. However, such a filter could be used to replace the isolator IS.

With this contradirectional configuration, the compensation wavelength λc can be close to one of the signal wavelengths λi. Nevertheless, it is appropriate to avoid choosing an identical wavelength since that would give rise to interference noise between the compensation wave and the signal.

The device of the invention operates as explained below with reference to the timing diagrams of FIG. 5. As in the preceding example, the signal to be amplified E is constituted by two channels E1 and E2. The signals E1, E2, and E are shown respectively in diagrams (a), (b), and (c).

The compensation wave E* is shown in diagram (d). The combination signal S whose instantaneous power is the sum of the instantaneous powers of E and E* can be seen in diagram (e). The amplified combination signal Sa appears in diagram (f).

The compensation wave E* is modulated inversely relative to the modulation on the signal E. If the modulation amplitudes of E and E* are at all times exactly equal in absolute value, then the combination signal S will present no modulation in its light power. This ideal circumstance is represented by dotted lines in timing diagrams (d) and (e).

Nevertheless, in practice, it can suffice merely to attenuate the modulation of S. Since the amplifier OA is insensitive to modulation at high frequency, it acts as a lowpass filter. Providing its cutoff frequency is lower than that of the modulation means 1, any residual modulation in S will be attenuated by the amplification. It is therefore advantageous to select an amplifier OA that is slow, i.e. that has a small confinement factor and/or that is short.

FIG. 6 shows a first embodiment of the device of the invention when it is desired to amplify an input signal EO that is available solely in optical form.

The input interface Ce is constituted by an input coupler whose input receives the signal EO. A first output from the coupler Ce is coupled to the amplifier OA (not shown) by means of a delay line 2 and the coupler Ca. A second output from the coupler Ce is coupled to the modulation means 1. The optical signal to be amplified E in this case corresponds to a fraction of the input optical signal EO as delayed by the delay line 2. The modulation means 1 receive from the coupler Ce another fraction e of the input optical signal EO and they deliver the compensation light wave E* to the amplifier OA via the coupler Ca.

In this embodiment, the modulation means 1 have an electrooptical modulator 3 of Mach-Zehnder type interferometer structure. A photodetector PD receives the fraction e of the input optical signal E0. It supplies an electrical signal which is applied to a control electrode of the modulator 3 via an electronic amplifier 4 and a T-coupler. The coupler serves to superpose the AC component of the voltage from the photodetector PD on a selected bias voltage Vp.

A laser source LD delivering a continuous carrier wave CW of wavelength λc is coupled to the Mach-Zehnder modulator 3 and outputs the compensation light wave E*.

The electronic amplifier 4 and the modulator 3 are selected so that the carrier wave CW is modulated inversely relative to the modulation on the signal E0. The delay line 2 serves to synchronize the signal to be amplified E with the compensation wave E*.

To ensure that the modulation amplitude of the compensation wave E* compensates the amplitude of the signal E, it is necessary for the modulation means 1 to possess an "antilinear" response relative to the optical signal sample e and for the power of the compensation wave E* to be adjusted accordingly. This condition can be satisfied by adjusting the power of the continuous wave CW, by acting on the current I that is injected into the laser LD.

Concerning linearity, account must be taken of the characteristics of the Mach-Zehnder modulator 3. The transmissivity T of the modulator as a function of the applied voltage V varies in accordance with the curve shown diagrammatically in FIG. 7. For a control voltage V that varies between two values V1 and V2 that are centered about the bias voltage Vp, it is possible to obtain a linear response merely by selecting Vp, V1, and V2 so as to remain within a substantially linear region of the curve.

The modulator of interferometer structure can be replaced by an electroabsorption modulation, as shown in FIG. 9. This variant presents the advantage of a response that is linear over a wider range of modulation amplitudes.

The laser source LD and the modulator 3 (of any type) can naturally be made in integrated manner.

FIG. 8 shows a first all-optical embodiment of the modulation means 1. These means are constituted by a wavelength converter having a second semiconductor light amplifier 5 which receives the auxiliary light carrier wave CW and, via a circulator 6, the fraction e of the input optical signal EO. The amplifier 5 operates under saturation conditions and its gain is modulated as a function of the power modulation of e. On passing through the amplifier 5, the auxiliary wave CW is amplified with this modulated gain, so a wave e* is obtained at the output having power that is modulated inversely compared with the power in e. The wave e* is received by the circulator 6 which then delivers the compensation wave E*.

The amplifier 5 is selected so as to possess a cutoff frequency that is high enough to react to rapid fluctuations in the amplitude of the input optical signal EO that would be filtered in sufficiently by the amplifier OA.

As before, it is desirable for the modulation means 1 to possess a response that is antilinear and for the power of the compensation wave E* to be properly adjusted. For this purpose, account needs to be taken in this case of the characteristics of the amplifier 5, i.e. of its gain curve. This curve is analogous to that shown in FIG. 2.

In order for the modulation of e̱ to give rise to inverse modulation of the gain, the operating point of the amplifier 5 is located in that portion of the gain curve which has negative slope. This slope is substantially constant using scales in decibels, but when using linear scales variations in gain are not accurately proportional to variations in input light power. The response of the modulation means 1 is therefore not truly linear.

The power of the compensation wave E* can easily be adjusted by adjusting the power of the continuous wave CW, by acting on the current I injected into the laser LD.

A problem can arise if the mean power of the input optical signal EO, and thus the mean power of e̱, varies over time while the power of the continuous wave CW remains constant. In order to ensure that the compensation wave E* has an acceptable extinction ratio, the power of the continuous wave CW is normally small compared with that of e̱. The operating point of the amplifier 5 is then practically determined by the mean power of e̱. If the mean power of EO (expressed in dBm) is subjected to an increase ΔP(E), that will give rise to the same increase in the powers of E and of e̱. However, from the gain curve, when operating under saturation conditions, an increase ΔP(E) (in dBm) in the mean power of e̱ will give rise to a decrease in gain of substantially the same value (in decibels). The mean power (in dBm) of e* and thus the mean power of E* is consequently decreased by the same amount.

Unfortunately, in order to ensure that the combination S of E and E* retains little modulation, it would be better, on the contrary, for the mean power (in dBm) of E* to increase together with ΔP(E). To satisfy this condition, one solution consists in increasing the power (in dBm) of the continuous wave CW by 2ΔP(E).

Consequently, if it is desired to increase the power dynamic range of the device, i.e. if the device is to remain effective in spite of possible variations in the mean power of the input signal EO, it is appropriate to provide means for automatically adjusting the mean power of E*.

Such means are shown diagrammatically in FIG. 8. They comprise in cascade: a photodetector 8; a lowpass electronic filter 9; a control electronic circuit 10; and an adjustable current source 11. The photodetector 8 is placed so as to receive a fraction of the input signal E0. The current source 11 supplies the laser LD with current I that varies as a function of a control signal supplied by the circuit 10.

The lowpass filter 9 serves to extract the mean power of E. The control circuit 10 is designed to produce a control signal that is a function of said measurement and that is adapted to the characteristics of the amplifier 5 in such a manner as to equalize the mean powers of E and E* on a continuous basis.

Optionally, it is also possible to provide an adjustable attenuator 7 that is also controlled by the circuit 10 and that is located between the circulator 6 and the coupler Ca. This element enables an additional increase in the power dynamic range of the device to be achieved.

It should be observed that this automatic adjustment of the mean power of E* is of use in practice only for relatively high powers in the input signal EO. When powers are low enough for the amplifier 5 to be operating under low saturation conditions, although its gain is modulated relatively little, it is high. As a result the power of E* is likewise modulated little and high, but the modulation of the input signal E0 will have little influence on the modulation of the combination signal S.

In a variant, as shown in FIG. 10, the modulation means 1 can be constituted by a wavelength converter having an interferometer structure, e.g. of the Mach-Zehnder type. The interferometer structure is provided with two branches, whose two ends receive a fraction of the auxiliary wave CW. The signal e̱ is injected into one of the branches which includes a material whose index varies as a function of the light power it receives. The other ends of the branches are coupled so as to supply the compensation wave E*.

As before, automatic adjustment means can be provided to act on the mean power of E*. It is also possible to place both types of wavelength converter in cascade.

Another embodiment as shown in FIG. 12 relates to the optical signal to be amplified E being produced from an electrical input signal EO that is available at the amplifier OA. This situation arises in transmitter terminals provided with a transmitter amplifier of the kind commonly referred to as a "booster".

As shown, the signal to be amplified E is supplied by an electrooptical modulator 11 which receives a signal carrier wave λi and which is controlled by the electrical signal EO.

The modulation means 1 are then constituted by another electrooptical modulator 12 receiving the auxiliary wave CW and controlled by an electrical signal EO* which is the complement of the input electrical signal EO.

What is claimed is:

1. A device for using a semiconductor light amplifier to amplify an amplitude-modulated optical signal referred to as the signal to be amplified and carried by at least one signal wavelength, the device comprising:

compensation means for producing a compensation light wave; and coupling means for injecting said optical signal to be amplified and said compensation light wave into said amplifier;

and wherein said compensation means comprise modulation means that are controlled directly as a function of the modulation of the signal to be amplified so as to produce said compensation light wave by amplitude modulating at least one auxiliary light carrier wave in such a manner that the combination of said optical signal to be amplified and of said compensation light wave has amplitude modulation that is suppressed or at least attenuated.

2. A device according to claim 1, wherein said auxiliary light carrier wave has a compensation wavelength that is different from said signal wavelength(s).

3. A device according to claim 1, wherein said compensation means include a delay device supplying said signal to be amplified from an input optical signal, and wherein said modulation means are suitable for modulating the amplitude of said auxiliary light carrier wave inversely relative to the modulation of said input signal.

4. A device according to claim 3, wherein said modulation means comprise a photodetector receiving a fraction of said input optical signal and controlling an electro-optical modulator, said compensation light wave being the result of modulating said auxiliary wave by means of said electro-optical modulator.

5. A device according to claim 3, wherein said electro-optical modulator is a modulator of interferometer structure.

6. A device according to claim 3, wherein said electro-optical modulator is an electroabsorption modulator.

7. A device according to claim 5, wherein said electro-optical modulator and said laser source are constituted by a laser with an integrated modulator.

8. A device according to claim 3, wherein said modulation means comprise a second semiconductor light amplifier receiving said auxiliary light carrier wave and a fraction of said input optical signal, said compensation light wave being the result of amplifying said auxiliary wave by means of said second amplifier whose gain is modulated by said fraction of the input optical signal.

9. A device according to claim 3, wherein said modulation means comprise an interferometer structure provided with two branches, each having first and second ends, said first ends receiving respective fractions of said auxiliary wave, one of said branches including a material whose index varies as a function of the light power received and receiving a fraction of said input optical signal, said second ends being coupled together to provide said compensation light wave.

10. A device according to claim 8, including means for automatically adjusting the mean power of said compensation light wave as a function of the mean power of said input optical signal.

11. A device according to claim 1, wherein said optical signal to be amplified is produced from an input electrical signal and said modulation means are constituted by an electro-optical modulator receiving said auxiliary wave and controlled by an electrical signal that is the complement of said input electrical signal.

12. A device according to claim 1, wherein said semiconductor light amplifier possesses a cutoff frequency which is lower than the cutoff frequency of said modulation means.

* * * * *